United States Patent
Sedlak

[19]

[11] Patent Number: 6,160,295
[45] Date of Patent: Dec. 12, 2000

[54] CMOS DEVICE

[75] Inventor: Holger Sedlak, München, Germany

[73] Assignee: Siemens Aktiengesellschaft, Munich, Germany

[21] Appl. No.: 09/091,152

[22] PCT Filed: Nov. 18, 1996

[86] PCT No.: PCT/DE96/02189

§ 371 Date: Sep. 4, 1998

§ 102(e) Date: Sep. 4, 1998

[87] PCT Pub. No.: WO97/21240

PCT Pub. Date: Jun. 12, 1997

[30] Foreign Application Priority Data

Dec. 6, 1995 [DE] Germany ............................ 195 45 554

[51] Int. Cl.[7] .................................................. H01L 29/72
[52] U.S. Cl. .......................... 257/369; 257/370; 257/371; 257/390; 257/773
[58] Field of Search ..................................... 257/369, 273, 257/350, 371, 370, 378, 351, 338, 357, 41, 107, 241, 250, 287, 390, 773

[56] References Cited

U.S. PATENT DOCUMENTS 5,336,911  8/1994  Furuhata .................................. 257/273

FOREIGN PATENT DOCUMENTS

| | | |
|---|---|---|
| 0 013 482 | 7/1980 | European Pat. Off. . |
| 0 197 730 | 10/1986 | European Pat. Off. . |
| 0 213 425 | 3/1987 | European Pat. Off. . |
| 28 22 094 | 12/1978 | Germany . |
| 195 16 423 | 11/1995 | Germany . |
| 59-178767 | 10/1984 | Japan ...................................... 257/353 |

OTHER PUBLICATIONS

W.G. Meyer et al., "Integrable High Voltage CMOS: Devices, Process Application", IEDM 85, pp. 732–735.

N. Weste et al., "Principles of CMOS VLSI Design A Systems Perspective", Addison–Wesley Publishing Company.

Japanese Abstract, 03096272, Apr. 22, 1991, "CMOS Semiconductor Device".

Japanese Abstract, 58223362, Dec. 24, 1983, "Semiconductor Device".

*Primary Examiner*—Edward Wojciechowicz
*Attorney, Agent, or Firm*—Hill & Simpson

[57] ABSTRACT

A CMOS arrangement is described which has at least one NMOS region (2) and at least one PMOS region (3) and which is provided at its surface with substrate contacts (24, 34), via which it is possible to apply predetermined voltage values to respective substrate sections (1, 30) of the CMOS arrangement. The CMOS arrangement described is distinguished by the fact that the average number of substrate contacts (24, 34) per unit area and/or the average substrate contact area per unit area within the at least one NMOS region (2) is significantly smaller than within the at least one PMOS region (3).

5 Claims, 2 Drawing Sheets

CMOS DEVICE

BACKGROUND OF THE INVENTION

1. Field of the Invention

The present invention relates to a CMOS arrangement which has at least one NMOS region and at least one PMOS region and which is provided at its surface with substrate contacts, via which it is possible to apply predetermined voltage values to respective substrate sections of the CMOS arrangement.

2. Description of the Related Art

CMOS arrangements of this type have been known for a long time and are extensively used. A practical embodiment of an arrangement of this type is shown in FIG. 2.

FIG. 2 is a diagrammatic cross-sectional view of a conventional CMOS arrangement.

The CMOS arrangement shown has a $p^-$-type substrate 1, in which an NMOS region 2 and a PMOS region 3 are formed.

An NMOS transistor 21 is formed in the NMOS region 2, the source section 22 of which transistor and the drain section 23 of which transistor are designed as $n^+$-regions provided within the $p^-$-type substrate 1.

In order to realize the PMOS region 3, an $n^-$-type substrate 30 which is embedded like a trough is provided within the $p^-$-type substrate 1. A PMOS transistor 31 is formed in this PMOS region 3, the source section 32 of the transistor and the drain section 33 of the transistor are designed as $p^+$-type regions provided within the $n^-$-type substrate 30.

The gate sections as well as the method of operation and the function of the respective transistors are not relevant to the following explanations; therefore, they are neither illustrated in FIG. 2 nor explained in more detail in the description.

The starting point for the further observations is, rather, the pnpn zone sequence in the CMOS arrangement shown in FIG. 2, which is formed by the sequence of (1) source and drain section 32 and 33, respectively, of the PMOS transistor 31, (2) $n^-$-type substrate 30 of the PMOS transistor 31, (3) $p^-$-type substrate 1 of the CMOS arrangement and of the NMOS transistor 21 and (4) source and drain section 22 and 23, respectively, of the NMOS transistor 21.

The abovementioned pnpn zone sequence is the zone sequence of a thyristor.

As long as the pn junction between zone (2) and zone (3), i.e. the junction between the $n^-$-type substrate 30 of the PMOS transistor 31 and the $p^-$-type substrate 1 of the CMOS arrangement and of the NMOS transistor 21, is in the blocking state, the thyristor is also in the off state and its presence has no effect on the function of the respective transistors.

However, if this junction goes into the conducting state (on account of charge carriers migrating about undesirably in the respective substrates), then the zones (1) and (4), i.e. the source and drain section 32 and 33, respectively, of the PMOS transistor 31 and the source and drain section 22 and 23, respectively, of the NMOS transistor 21, are electrically connected to one another, which leads to incorrect functioning or even to destruction of the respective transistors.

In order to avoid undesirable thyristor effects of this type in CMOS arrangements, i.e. in order to increase the so-called latch-up resistance, the surface of the CMOS arrangement is provided with substrate contacts.

These substrate contacts are realized as p+-type sections 24 that are connected to ground in the NMOS region 2, and as $n^+$-type sections 34 connected to a positive voltage in the PMOS region 3. In this way, the charge carriers in question, which render the pn junction conductive, are prevented from freely migrating about in the respective substrates, thereby precluding unintentional triggering of the thyristor.

In order reliably to ensure this effect, however, it is necessary to observe specific maximum distances between neighbouring substrate contacts and between the substrate contacts and the source and drain sections of the respective transistors. A typical maximum value for the distance between neighbouring substrate contacts is approximately 50 $\mu$m, and a typical maximum value for the distance between the substrate contacts and the source and drain sections of the respective transistors is approximately 25 $\mu$m.

In order to reliably comply with these conditions, the known CMOS arrangements are, as a rule, covered by a uniform grid pattern of substrate contacts. A structure of this type is illustrated in FIG. 3.

FIG. 3 illustrates the arrangement of the substrate contacts on the surface of a conventional CMOS arrangement.

The substrate contacts, which are each marked by a •(dot), are distributed uniformly over the entire CMOS arrangement, the distance between neighbouring substrate contacts being essentially constantly approximately 50 $\mu$m.

It is obvious that the provision of substrate contacts of this type leads to a not inconsiderable enlargement of the CMOS arrangement, or imposes limits on any further miniaturization of the same.

SUMMARY OF THE INVENTION

The present invention is therefore based on the object of developing the CMOS arrangement which has at least one NMOS region and at least one PMOS region and which is provided at its surface with substrate contacts, via which it is possible to apply redetermined voltage values to respect substrate sections of the CMOS arrangement in such a way that it can be miniaturized further while maintaining its latch-up resistance.

This and other objects and advantages are achieved according to the invention by means of the the average number of substrate contacts per unit area and/or the average substrate contact area per unit area within the at least one NMOS region being significantly smaller than within the at least one PMOS region.

Accordingly, it is provided that the average number of substrate contacts per unit area and/or the average substrate contact area per unit area within the at least one NMOS region is significantly smaller than within the at least one PMOS region.

The provision of this feature has the effect (1) that the total number of substrate contacts to be provided on a CMOS arrangement and/or the substrate contact area required by the said substrate contacts can be reduced, and (2) that the electronic components formed within the CMOS arrangement can be packed more densely at those points where a small number of substrate contacts is provided per unit area and/or a small substrate contact area is provided per unit area.

This allows a given circuit, which is to be constructed using CMOS technology, to be realized on a smaller area than was previously the case.

Investigations have revealed that the latch-up resistance is not impaired by the provision of the measure according to the invention. Consequently, a CMOS arrangement was provided which can be miniaturized further while retaining its latch-up resistance.

The present arrangement provides further advantages when at least one NMOS region is essentially free of substrate contacts. Alternatively, the CMOS arrangement has the number of substrate contacts per unit area in the at least one NMOS region being higher at the region boundary than in the center of the region.

BRIEF DESCRIPTION OF THE DRAWINGS

The invention is explained in more detail below using exemplary embodiments with reference to the drawing.

DETAILED DESCRIPTION OF THE PREFERRED EMBODIMENTS

Figure 1:
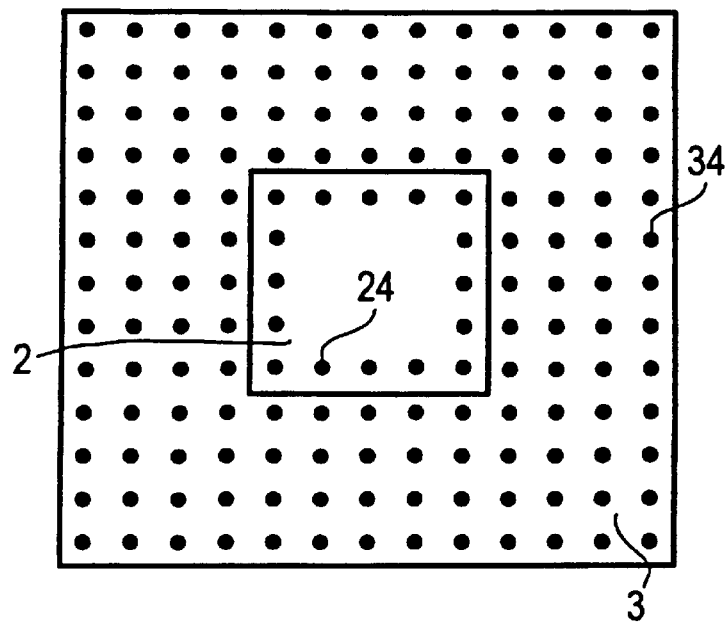
FIG. 1 shows a diagrammatic illustration of a plan view of a CMOS arrangement designed according to the invention, in order to illustrate the arrangement of substrate contacts on the surface of the same.
Figure 3:
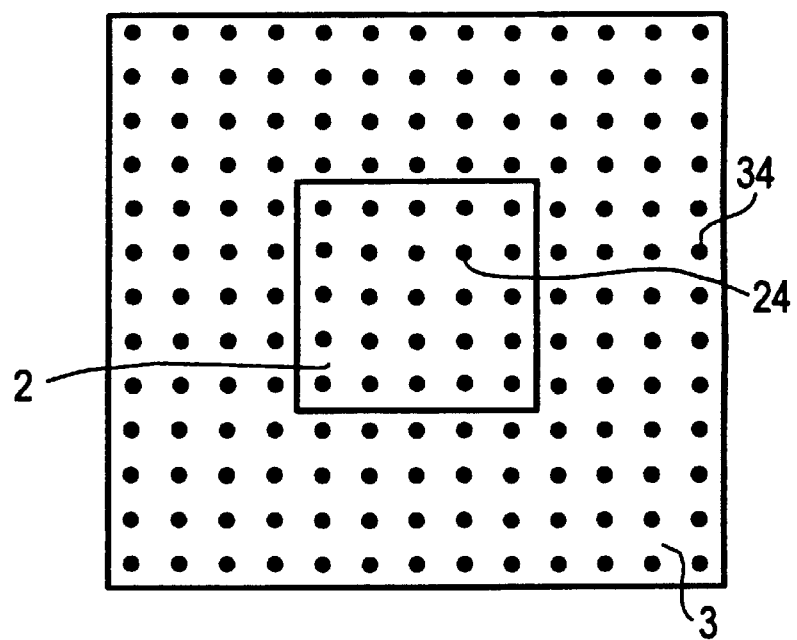
FIG. 3 shows a diagrammatic illustration of a plan view of a conventional CMOS arrangement, in order to illustrate the arrangement of the substrate contacts on the surface of the same.
Figure 2:
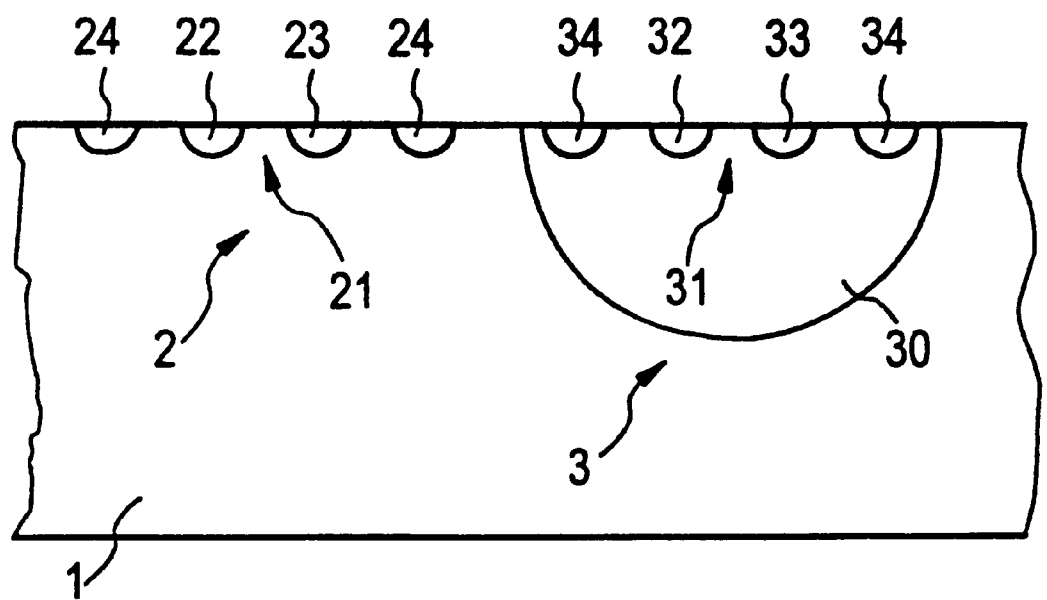
FIG. 2 shows a diagrammatic cross-sectional view of a conventional CMOS arrangement.

The CMOS arrangement shown in FIG. 1 has, apart from the substrate contacts, the same fundamental structure as the conventional CMOS arrangement illustrated in FIG. 2. That is to say at comprises at least one NMOS region 2 and at least one PMOS region 3, which can essentially be constructed in the manner shown in FIG. 2 and which can adjoin one another in the manner shown in FIG. 1.

In order to increase the latch-up resistance, substrate contacts are again provided on the connection side, shown in the plan view in FIG. 1, of the CMOS arrangement. However, the number and arrangement of the substrate contacts is modified according to the invention in such a way that the average number of substrate contacts per unit area and/or the average substrate contact area per unit area within the at least one NMOS region is significantly smaller than within the at least one PMOS region.

One possible embodiment of the measure according to the invention consists in providing, as is shown in FIG. 1, the at least one PMOS region 3 with substrate contacts in a known manner as described in the introduction, while the NMOS region 2 is provided with substrate contacts only at the edge.

It has been discovered that, contrary to the previous opinion of technical specialists, it is possible, when sufficiently many and/or large substrate contacts are provided in the PMOS region, to dispense entirely or at least to the largest possible extent with the substrate contacts within the NMOS region, without having to accept appreciable losses in the latch-up resistance.

According to FIG. 1, only a small number of substrate contacts are provided in the NMOS region 2 shown there, whereas the PMOS region 3 has substrate contacts 34 of known density and size, i.e. with a mutual distance of, for example, approximately 50 µm; the reduction in the previously customarily provided number of substrate contacts and/or substrate contact area (sum of the areas of the individual substrate contacts) in the NMOS region makes it unnecessary to simultaneously increase the number of substrate contacts and/or the substrate contact area within the PMOS region.

The provision of substrate contacts at the region boundary leads, largely independently of the number provided and/or of the area occupied, at most to a slightly reduced miniaturizability of the CMOS arrangement, because the electronic components realized in the NMOS region in question cannot be placed arbitrarily near to the region boundary anyway, for reasons of safety and reliability.

Independently of the selected form in which the measure, according to the invention is realized, it is possible, owing to the absolute capability of reducing the number of substrate contacts and/or the substrate contact area occupied, to provide a higher component density of the electrical components within the NMOS region, which leads to a considerable reduction in the area of the arrangement. In test arrangements with selected pure NMOS regions, for example ROMs, the area reduction was several ten per cent.

Apart from this, the provision of the measure according to the invention also permits simpler and cheaper production of cmos arrangements (fewer restrictions in the layout, smaller number of contact points to be connected or made contact with, lower material consumption).

Although other modifications and changes may be suggested by those skilled in the art, it is the intention of the inventors to embody within the patent warranted hereon all changes and modifications as reasonably and properly come within the scope of their contribution to the art.

What is claimed is:

1. A CMOS arrangement, comprising:

a substrate;

at least one NMOS region in said substrate;

at least one PMOS region in said substrate substrate contacts on a major surface of said substrate via which it is possible to apply redetermined voltage values to respective substrate sections of the CMOS arrangement, an average number of substrate contacts per unit area within the at least one NMOS region being significantly smaller than an average number of substrate contacts within the at least one PMOS region.

2. CMOS arrangement according to claim 1, wherein said at least one NMOS region is essentially free of substrate contacts.

3. A CMOS arrangement, comprising:

a substrate;

at least one NMOS region in said substrate;

at least one PMOS region in said substrate;

substrate contacts on a major surface of said substrate via which it is possible to apply predetermined voltage values to respective substrate sections of the CMOS arrangement, an average number of substrate contacts per unit area within the at least one NMOS region being significantly smaller than an average number of substrate contacts within the at least one PMOS region;

wherein said at least one NMOS region is essentially free of substrate contacts; and wherein a number of said substrate contacts per unit area in the at least one NMOS region is higher at a region boundary than in a center of the at least one NMOS region.

4. A CMOS arrangement, comprising:

a substrate;

at least one NMOS region in said substrate;

at least one PMOS region in said substrate;

substrate contacts on a major surface of said substrate via which it is possible to apply redetermined voltage values to respective substrate sections of the CMOS arrangement, an average substrate contact area per unit area within the at least one NMOS region being significantly smaller than an average substrate contact area per unit area within the at least one PMOS region.

5. A CMOS arrangement, comprising:

a substrate;

at least one NMOS region in said substrate;

at least one PMOS region in said substrate substrate contacts on a major surface of said substrate via which it is possible to apply predetermined voltage values to respective substrate sections of the CMOS arrangement, said predetermined voltage values being sufficient to increase latch-up resistance so as to avoid thyristor effects, an average number of substrate contacts per unit area within the at least one NMOS region being significantly smaller than an average number of substrate contacts within the at least one PMOS region.

* * * * *